US006803770B2

United States Patent
Pereira et al.

(10) Patent No.: US 6,803,770 B2
(45) Date of Patent: Oct. 12, 2004

(54) WIRELESS MULTICONDUCTOR CABLE TEST SYSTEM AND METHOD

(75) Inventors: Fernando J. Pereira, Jamestown, RI (US); Raymond U. Huot, Middletown, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 219 days.

(21) Appl. No.: 10/267,885

(22) Filed: Oct. 8, 2002

(65) Prior Publication Data

US 2004/0066202 A1 Apr. 8, 2004

(51) Int. Cl.[7] ............................................. G01R 31/08
(52) U.S. Cl. ...................................... 324/539; 324/514
(58) Field of Search .................................. 324/514, 539

(56) References Cited

U.S. PATENT DOCUMENTS

| | | | | |
|---|---|---|---|---|
| 3,986,106 A | * | 10/1976 | Shuck et al. ................. | 324/540 |
| 4,389,694 A | * | 6/1983 | Cornwell, Jr. ................ | 361/48 |
| 4,814,693 A | * | 3/1989 | Coben .......................... | 324/66 |
| 5,027,074 A | * | 6/1991 | Haferstat ..................... | 324/539 |
| 5,128,619 A | * | 7/1992 | Bjork et al. .................. | 324/533 |
| 5,436,554 A | * | 7/1995 | Decker, Jr. .................... | 324/66 |
| 5,548,820 A | * | 8/1996 | Victorin ..................... | 455/67.14 |
| 5,565,783 A | * | 10/1996 | Lau et al. ..................... | 324/522 |
| 5,667,387 A | * | 9/1997 | Klemm ......................... | 434/224 |
| 5,760,590 A | * | 6/1998 | Striffler ...................... | 324/514 |
| 6,236,952 B1 | * | 5/2001 | Jun et al. ..................... | 702/119 |
| 6,483,318 B1 | * | 11/2002 | White et al. ................. | 324/539 |

FOREIGN PATENT DOCUMENTS

JP         2002152381 A    *  5/2002    ............ H04M/3/22

\* cited by examiner

Primary Examiner—Charles H. Nolan, Jr.
(74) Attorney, Agent, or Firm—James M. Kasischke; Michael F. Oglo; Jean-Paul A. Nasser

(57) ABSTRACT

A tester for testing multiconductor cable having a first tester is connectable to a first end of the multiconductor cable. The first tester produces one or more test signals individually on each conductor of the cable. A second tester is connectable to the second end of the cable at a remote location. The second tester monitors each of the plurality of separate conductors to detect the test signals produced by the first tester. Preferably, a first wireless transceiver is provided for the first tester that wirelessly transmits control signals to automatically coordinate testing procedure control. A second wireless transceiver joined to the second tester wirelessly transmits test result data.

11 Claims, 1 Drawing Sheet

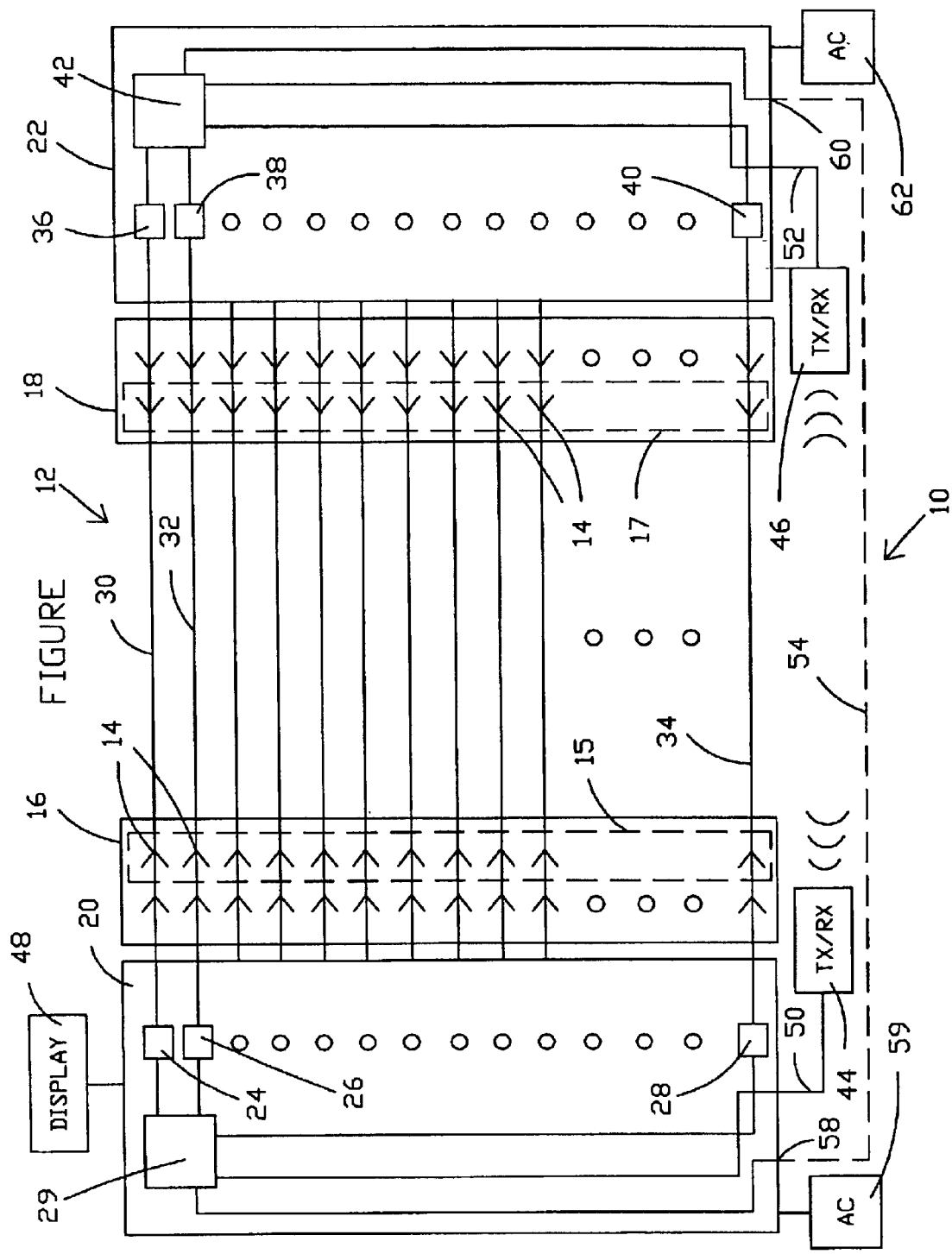

WIRELESS MULTICONDUCTOR CABLE TEST SYSTEM AND METHOD

STATEMENT OF THE GOVERNMENT INTEREST

The invention described herein may be manufactured and used by or for the Government of the United States of America for Governmental purposes without the payment of any royalties thereon or therefore.

BACKGROUND OF THE INVENTION (1) Field of the Invention

The present invention relates generally to systems and methods for testing multi-conductor cables and, more particularly, to a wireless multiconductor cable tester and method.

(2) Description of the Prior Art

Multiconductor cable is required for many electronic devices such as digital equipment to provide a plurality of signal paths for digital signals. A typical multiconductor cable may be comprised of many conductors to permit simultaneous parallel transmission of multiple digital signals, control signals, DC power levels, and the like. For instance, one typical multiconductor cable has a standard one hundred conductor construction with suitable connectors on either end. Depending on the type of installation, multiconductor cables may extend distances several hundred feet long. Many types of problems may arise with such cables including but not limited to, miswirings such as miswiring of appropriate pins on the plugs of opposite ends of the cable, open circuits or lack of continuity, shorts, and the like. In some cases, the multiconductor cable may be provided in standard sections, such as twenty-five foot sections, so that suitable lengths require connecting several different sections of the cable together.

During fabrication, closed loop testing of the multiconductor cable is facilitated because both ends of the uninstalled multiconductor cable are readily available for connection to a closed loop multiconductor cable tester. In this situation, it is possible to easily connect the closed loop multiconductor cable tester to automatically comprehensively test the cable because the plugs of opposite ends of the multiconductor cable are normally readily available for connection to the cable tester. The closed loop tester is able to test and measure test signals on each conductor in the multiconductor cable separately while monitoring all other conductors for miss-wires and other problem conditions.

After installation of the cable, the closed-loop multiconductor cable tester requires the use of an extender cable that must be temporarily installed between the closed-loop cable tester and the far end of the cable under test. Such temporary extender cables tend to be heavy. Storage, maintenance, relocation, set up, and the like, of these extender cables for testing purposes tends to be cumbersome, time consuming, and costly. Such cable may comprise twenty-five foot lengths with generic 100-pin connectors on each end. The extender cables are prone to damage when they are temporarily installed, removed, and reinstalled as a system installation progresses. The extender cables are usually laid out in general passageways where they are subject to abuse from foot traffic and other construction activities. The extender multiconductor cables inherently have a rather high susceptibility to damage due to the large number of conductors and connections therein as compared to, for instance, single conductor cable. The extender cables therefore frequently become a subject of test and repair, making tracing of the cause of problems more difficult. Damaged extender cables can significantly lengthen the system checkout process due to the introduction of additional errors during testing.

While the automated closed loop multiconductor cable tester has been preferred in the past, due to the difficulties of closed loop testing of installed multiconductor cables, an automated open loop multiconductor cable tester has also been developed. The open loop tester utilizes a shorting plug at the far end of the cable under test. The shorting plug connects all pins together. The open loop tester uses one pin (usually pin 1) as a return path. Then logic level signals are applied in sequence to each remaining pin in the connector as determined by a pre-stored wiring list. The open loop multiconductor cable tester senses if there is continuity in each individual conductor, records the results, and then sequences to the next pin. However, the open loop multiconductor cable tester does not detect all problems. For instance, if there is a miswiring problem, where the continuity of the incorrectly connected wires is otherwise good, the open loop multiconductor cable tester will not sense the error.

Various inventors have attempted to solve related problems as evidenced by the following patents, without providing the solutions taught hereinafter.

U.S. Pat. No. 3,986,106 issued Oct. 12, 1976, to Shuck et al, discloses a portable cable test set that includes a master unit connected to one end of a cable made up of multiple wire pairs and a remote unit connected to the other end. The master unit generates a series of digital pulses, a pulse being applied to a first wire of each wire pair in a predetermined sequence. The remote unit interconnects the wire pair with a resistor of predetermined resistance which differs from every other resistor and which is much greater than the resistance of the wire pair undergoing testing. A corresponding resistor of like value is included in the master unit and receives the same pulse that is applied to the wire undergoing testing. A comparator in the master unit compares the magnitude of the pulse sent over the wire pair with the magnitude of the pulse sent through the reference resistance in the master unit and a sequencer applies the next pulse to the next wire and next corresponding resistance when the preceding pulse magnitudes are equivalent. An interrupter stops the test sequence when the compared pulses are unequal in magnitude, and an indicator then identifies the wire pair having conditions activating the sequence interrupter.

U.S. Pat. No. 4,389,694, issued Jun. 21, 1983, to R. Cornwell, Jr., discloses a monitoring system for insuring the continuity and integrity of a power distribution system comprising a plurality of trailing cables, each trailing cable connected at a central station to a common power source and transmitting a power energizing signal to a load disposed at a remote location. In particular, the monitoring system comprises a transmitter and receiver for each trailing cable of the power distribution system whereby a monitoring signal is transmitted from the central station to the remote location and returned for detection by the receiver. If there is a fault condition within the trailing cable, the receiver provides a signal indicative thereof to be applied to a circuit breaker or coupling switch actuating the coupling switch to its open position thereby disconnecting the power from the trailing cable and its load. When a monitoring signal is successively transmitted and detected, the receiver provides a manifestation indicating the integrity and continuity of its trailing cable and actuates its coupling switch to its closed position, thus applying an energizing signal via its conductor to the load. The transmitter dedicated to each trailing cable includes means responsive to the frequency or frequencies of the previously generated monitoring signals, even from other transmitters, for generating a monitoring signal of substantially the same frequency whereby the monitoring signals as applied via the common AC power bus will be of substantially the same frequency. As a result, the monitoring system of this invention tends to eliminate the production of difference or beat signals and the resultant false indications of a fault condition within one or more of the trailing cables.

U.S. Pat. No. 5,027,074, issued Jun. 25, 1991, to E. C. Haferstat, discloses a cable tester for testing the individual conductors of a multiconductor cable. The cable tester includes a transmitter for connection to one end of the cable and a receiver for connection to the opposite end of the cable. The receiver includes a microprocessor having an EPROM memory. The receiver also includes an LCD display and a keypad for data input. In use the transmitter sequentially generates voltage pulses through each conductor of the cable and to the receiver. The receiver monitors these pulses at the opposite end of the cable and feeds this data into the microprocessor for processing and display on the LCD display. The cable tester quickly detects shots, opens, or crossed conductors within the cable and provides results of the testing on the LCD display.

U.S. Pat. No. 5,436,554, issued Jul. 25, 1995, to H. J. Decker, Jr., discloses a device for determining interconnections between terminal positions at opposite ends of cable includes a test circuit, connectors for connecting the test circuit to the terminal positions of the cable and a connector for interfacing the test circuit with a computer. The test circuit sequentially selects each of the terminal positions of the cable as a test point and includes a demultiplexing/multiplexing device for applying a test voltage to the selected terminal position, a resistor for maintaining a load resistance effective to provide a second logic signal at each terminal position other than the terminal position as the test point to which the test voltage is applied and to maintain a first logic signal at each terminal position to which the test voltage is not applied, a memory device for storing the logic signal present at each terminal position during application of the test voltage to the selected test point terminal position, and the demultiplexing and multiplexing device for determining, subsequent to removal of the test voltage from the test point, the logic signals stored by the memory device for each terminal position. A stored first logic signal is indicative of a terminal position not having a common connection with the test point and a stored second logic signal is indicative of a terminal position having a common connection with the test point. A method for determining interconnections between terminal positions at opposite ends of a cable includes operating the above-described device.

U.S. Pat. No. 5,565,783, issued Oct. 15, 1996, to Lau et al., discloses a method and a fault sensor device which can detect and distinguish abnormal current and voltage events on an alternating current overhead and underground transmission line or distribution line. The fault sensor device is contained in an elongated molded plastic housing, The fault sensor device includes a current sensor and a voltage sensor connected in proximity to the transmission or distribution line for monitoring current and voltage analog signals; an analog-to-digital converter connected to the current and voltage sensors for sampling the current and voltage analog signals and producing: corresponding digital signals; a processor responsive to the digital signals for detecting an abnormal condition and distinguishing whether any of a plurality of types of faults has occurred; and a transmitter for transmitting the fault information from the processor to a remote location.

U.S. Pat. No. 6,236,952 B1, issued May 22, 2001, to Jun et al., discloses a system wherein production information for ASIC (Application Specific Integrated Circuit) devices is stored in a database of a remote host system, and data necessary for a test program which controls testers for testing the IC devices is automatically created and transmitted to a tester host. This automatic system collects the data necessary for the test condition from the remote host database; creates the test condition by comparing the collected data with a predetermined handling condition; transmits the test condition to a tester host which controls a plurality of testers using corresponding test programs; and loads the test condition into the corresponding test program. This system avoids human errors which often result when test engineers write test conditions manually, and also allows quick response to a situation when new specific IC devices are required by a customer.

The above patents do not disclose a system and method operable for effectively providing the benefits of closed loop testing of multiconductor cable wherein the ends thereof are not readily available for connection to a closed loop tester without requiring a multiconductor extender cable. Those skilled in the art will appreciate the present invention which addresses the above and other problems.

SUMMARY OF THE INVENTION

Accordingly, it is an objective of the present invention to provide an improved system and method for testing multiconductor cables.

Another objective is to provide a system and method as aforesaid which may be utilized to avoid the need for multiconductor extender cables.

A further objective is to provide a system and method as aforesaid whereby the test results of the condition of the multiconductor cable are equivalent to those obtained by closed loop testing of the multiconductor cable when using multiconductor extender cables.

These and other objectives, features, and advantages of the present invention will become apparent from the drawings, the descriptions given herein, and the appended claims. However, it will be understood that the above listed objectives and advantages of the invention are intended only as an aid in understanding aspects of the invention, and are not intended to limit the invention in any way, and do not form a comprehensive list of objectives, features, and advantages.

Accordingly, the present invention provides a tester for testing multiconductor cable wherein the multiconductor cable may be comprised of a plurality of separate conductors. The tester may comprise one or more elements such as, for instance, a first cable tester unit connectable to a first end of the multiconductor cable. The first cable tester unit is preferably operable for producing one or more test signals individually on each of the plurality of separate conductors. A second cable tester unit is connectable to the second end of the multiconductor cable, which may be several hundred feet away. The second cable tester unit is operable for individually monitoring each of the plurality of separate conductors to detect the one or more test signals produced by the first cable tester unit. In preferred embodiment, a first wireless transceiver is provided for the first cable tester that is operable for wirelessly transmitting control signals for testing of the multiconductor cable. A second wireless transceiver is provided for the second cable tester operable for wirelessly transmitting test result data for the plurality of separate conductors to the first wireless transceiver. A display may be provided for displaying test results received by the first wireless transceiver from the second wireless transceiver which shows the condition of the multiconductor cable. In a preferred embodiment, individual AC power supply connections separately power the first and second cable tester units. The units may comprise a hardwired serial connection between the first cable tester unit and the second cable tester unit to provide an alternatively useable data link between the first cable tester unit and the second cable tester unit. In another embodiment, the hardwired serial connection may be provided instead of the wireless transceivers. The first and second cable tester units each preferably utilize a controller, such as a microprocessor or the like, for controlling operation of the respective cable tester units. Data may be input to the cable tester units via a PC connection. Stored data may include pin out information related to the multiconductor cable or other types of cables to be tested. The first cable testing unit and the second cable testing unit comprise separate data connections for each of the plurality of separate conductors in the multiconductor cable so that each conductor can be tested separately from the rest.

In operation, a method is provided for testing multiconductor cables which may comprise one or more steps such as producing one or more test signals on the first end of each of the plurality of separate conductors of the multiconductor cable through the first connector, individually monitoring the second end of each of the plurality of separate conductors to detect the one or more test signals and produce cable test result data, and wirelessly transmitting the cable test result data for the plurality of separate conductors from a location adjacent the second end of the multiconductor. Other steps may comprise wirelessly transmitting synchronization data related to the one or more test signals from a location adjacent the first end of the multiconductor cable. The cable test result data is preferably automatically analyzed and information related to the condition of the multiconductor cable is displayed.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawing wherein corresponding reference characters indicate corresponding parts throughout the drawing and wherein the FIGURE is a block diagram schematic showing one possible embodiment of a wireless multiconductor cable test system in accord with the present invention.

BRIEF DESCRIPTION OF THE PREFERRED EMBODIMENTS

Referring now to the drawing and, more particularly to the FIGURE, there is shown wireless multiconductor cable test system 10 in accord with one possible embodiment of the present invention. Wireless multiconductor cable test system 10 may be utilized to provide the benefits of closed loop testing of multiconductor cable 12 without the need for bulky and time consuming usage of multiconductor extender cables. A typical multiconductor cable 12 will have one hundred pin/plug contacts 14 at each end of multiconductor cable 12. More generally, a multiconductor cables will have at least five to nine or more separate conductors and/or twisted wire pairs, but will typically have many more separate conductors. However, the present invention can be used for testing multiconductor cables having any number N of conductors. Pin/plug contacts 14, which may be of different types, are normally mounted in respective cable end plugs 15 and 17 at opposite ends of multiconductor cable 12. Plug interconnections 16 and 18 that interconnect to tester 20 and remote processor 22 to multiconductor cable 100 will typically be male/female plug interconnections which provide a mating connection to cable end plugs 15 and 17. While cable end plugs 15 and 17 are generally of a standard type, cross-over or adapter plugs can be utilized to permit the present invention to work with virtually any type of connectors or plugs 15 and 17 found on the ends of multiconductor cable 12. The invention is, thus, not limited by the type of or absence of connectors at the ends of cable 12.

After installation of multiconductor cable 12 for its intended purpose, the opposite ends, and hence cable end plugs 15 and 17, may frequently be separated by hundreds of feet, or at any lengths within the signal carrying capability of multiconductor cable 12. In some cases, sections of multiconductor cables may be utilized to form cable 12, with plug connections at each section whereby the present invention may be utilized, as necessary, for troubleshooting to determine faulty cable sections as well as the particular cable conductors or miss-wires that cause the problem.

The present invention permits individual testing of each conductor. Thus, for each conductor in multiconductor cable 12, a separate signal may be injected. For instance, any number N of elements, such as elements 24, 26, 28 within tester 20, may be used to electrically connect to the individual conductors such as corresponding conductors 30, 32, and 34 of multiconductor cable 12. Elements 24, 26, and 28 may comprise individual logic elements, senders, receivers, transceivers, or may simply comprise wire connections that connect to a multiplexer, sequencer, or the like. Controller 29 may be of the type desired depending on the type of testing to control the testing procedures, signals, timing, and the like. Likewise, elements 36, 38, and 40 within remote processor 22 may be corresponding components to 24, 26, and 28 such as individual logic elements, senders, receivers, transceivers, or may simply comprise wire connections that connect to a multiplexer, sequencer, or the like. Thus, a signal transmitted by element 24, assuming good continuity and no shorts in multiconductor cable 12, will be received only by corresponding element 36. If multiconductor cable 12 is miswired, then the same signal might be received by other elements such as 38, 40, or any of the other N number of elements in remote processor 22. Other tests such a cross-channel noise levels, signal attenuation, and the like may also be performed, as desired. Vibration and/or tension may be applied to multiconductor 12 to test for intermittent connection problems and the like during testing, as desired. Controller 42 may be used to monitor, store, and transmit test results, as desired.

In order to display the test results at display 48, and/or to perform and coordinate the various types of tests, without the need for reliance on multiconductor 12, wireless transceiver 44 is provided on tester 20 and a corresponding wireless transceiver 46 is provided on remote processor 42. Transceivers 44 and 46 may be of any desired type. If desired, duplex or two-way continuous operation may be provided or as desired. If desired, cables 50 and 52, which may represent cables between any portion of the transceiver units, such as between the antennas and a transmitter/ receiver electronics section, or between a transceiver with built in antenna, or any other desired configuration. Thus, cables 50 and 52 may be sufficiently long to be positioned for a suitable wireless connection even in the midst of significant construction clutter. If necessary, repeater transceiver units may also be provided as necessary to provide reliable communication. Where communication is not otherwise possible, alternative signal route 54 may be utilized. Alternative signal route 54 may be an easily laid out, lighter, cable such as a serial interface with RS 232 or 10 BaseT Ethernet connection. Ethernet connections may be already available through computer networks, wireless networks or the like, which do not require an additional Ethernet cable directly between tester 20 and remote processor 22. Thus, connection 54 may represent any kind of cable or connection which may be easily provided or is already available and preferably requires only a single conductor cable, which may be shielded and resistant to damage. Serial connectors 58 and 60 may be utilized for connecting to Ethernet cables of any type for use with cable 54 or other interconnections. Serial connectors 58 and 60, or any other suitable connectors or wireless transceivers, may also be utilized for connecting to a PC, network, or a PC wireless network for programming of controllers 29 and 42.

Tester 20 and remote processor 22 may be mounted in rugged cases. Preferably tester 20 and remote processor 22 utilize standard power connections such as 110 volt AC connections or power adapters 59 and 62. A battery could be provided for when AC connections are unavailable. Controllers 29 and 42 are preferably programmable and being able to store programs for performing desired tests. Data concerning the types of cables to be tested may include pin out information and other cable specification data, as desired, so that cable testing programs may automatically utilize the data for specific cables.

In operation, cable tester 20, which may be referred to as a first cable tester unit, preferably sends synchronization information and commands to remote processor 22 via any of the means discussed herein before such as by transceivers 44 and 46 or serial cable 54. Synchronization data may relate to synchronizing testing of any number N different conductors such as conductors 30, 32, and 34. Commands may relate to initiation of the testing and the types of testing to be performed. Remote processor 22 receives the synchronization information and responds to commands to monitor signals received on any number N of conductors 30, 32, and 34 as may be produced by tester 20. Remote processor provides status information to cable tester 20 to indicate various status conditions such as communication status of transceivers 44 and 46, readiness for monitoring, and so forth. Remote processor 22 receives data for the desired test of multiconductor cable 12 in response to commands and synchronization signals from cable tester 20. The collected data, which may be referred to as test result data, may be temporarily in registers or the like and/or immediately transmitted from remote processor 22 to tester 20. Upon analysis of test result data, information regarding the condition of the multiconductor cable can be displayed on display 48. For instance, if the test is not successful, the particular miss-wired pins and conductors may be displayed on display 48 so that the components can be quickly located and fixed. Test results may also be printed out, stored for later analysis, used with other systems tests, or otherwise used as desired.

Therefore, it will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A tester for testing multiconductor cable, said multiconductor cable being comprised of a plurality of separate conductors, a first end and a second end, said tester comprising:
   a first cable tester unit connectable to the first end of said multiconductor cable, said first cable tester unit being operable for producing one or more test signals individually on each of said plurality of separate conductors;
   a second cable tester unit connectable to the second end of said multiconductor cable, said second cable tester unit being operable for individually monitoring each of said plurality of separate conductors to detect said one or more test signals produced by said first cable tester unit and for producing test result data related to a condition of said multiconductor cable; and
   a second wireless transceiver joined to said second cable tester unit, said second wireless transceiver being operable for wirelessly transmitting said test result data for said plurality of separate conductors.

2. The tester of claim 1 further comprising a first wireless transceiver joined to said first cable tester unit, said second wireless transceiver being operable for receiving signals from said first wireless transceiver, said second wireless transceiver being operable for wirelessly transmitting said test result data for said plurality of separate conductors to said first wireless transceiver.

3. The tester of claim 1 further comprising a display for displaying information related to said condition of said multiconductor cable.

4. The tester of claim 1 further comprising an AC power supply joined to power said second cable tester unit independently of said multiconductor cable.

5. The tester of claim 1 further comprising a selectively useable hardwired serial connection between said first cable tester unit and said second cable tester unit to provide an alternatively useable data link between said first cable tester unit and said second cable tester unit.

6. The tester of claim 1 further comprising a controller for said first cable testing unit operable for storing pin out information related to said multiconductor cable.

7. The tester of claim 1 further comprising separate data connections in each of said first cable testing unit and said second cable testing unit for each of said plurality of separate conductors in said multiconductor cable.

8. The tester of claim 1 further comprising:
   a first mating plug joined to connect said first cable testing unit to said first end of said multiconductor cable and a second mating plug connection joined to connect said second cable testing unit to said second end of said multiconductor cable; and
   said multiconductor cable having a first plug at the first end and a second plug at the second end.

9. A method for testing multiconductor cable wherein said multiconductor cable comprises of a plurality of separate conductors, said multiconductor cable having first end and a second end, said method comprising:
   producing at least one test signal on each of said plurality of separate conductors of said multiconductor cable at the first end;
   individually monitoring each of said plurality of separate conductors at the second end to detect said at least one test signal;

producing cable test result data from said monitored test;

wirelessly transmitting said cable test result data for said plurality of separate conductors; and wirelessly receiving said cable test result data for said plurality of separate conductors.

10. The method of claim 9 further comprising wirelessly transmitting synchronization data related to said one or more test signals from a location adjacent said first end of said multiconductor cable.

11. The method of claim 10 further comprising:
analyzing said cable test result data; and
displaying information related to a condition of said multiconductor cable.

* * * * *